United States Patent
Hosoya

(10) Patent No.: US 10,242,745 B2
(45) Date of Patent: Mar. 26, 2019

(54) SEMICONDUCTOR MEMORY DEVICE THAT GENERATES VOLTAGES APPLIED TO MEMORY CELLS BASED ON A SIGNAL FROM A TEMPERATURE SENSOR

(71) Applicant: Toshiba Memory Corporation, Tokyo (JP)

(72) Inventor: Masahiro Hosoya, Yokohama Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/693,402

(22) Filed: Aug. 31, 2017

(65) Prior Publication Data

US 2018/0277223 A1 Sep. 27, 2018

(30) Foreign Application Priority Data

Mar. 21, 2017 (JP) .................. 2017-054925

(51) Int. Cl.
| | | |
|---|---|---|
| *G11C 7/04* | (2006.01) | |
| *G11C 16/10* | (2006.01) | |
| *G11C 11/56* | (2006.01) | |
| *G11C 16/34* | (2006.01) | |
| *G11C 16/26* | (2006.01) | |
| *G11C 16/04* | (2006.01) | |

(52) U.S. Cl.
CPC ............. *G11C 16/105* (2013.01); *G11C 7/04* (2013.01); *G11C 11/5642* (2013.01); *G11C 16/0483* (2013.01); *G11C 16/26* (2013.01); *G11C 16/3404* (2013.01)

(58) Field of Classification Search
CPC ......................................... G11C 7/04
USPC ......................................... 365/212
See application file for complete search history.

(56) References Cited

U.S. PATENT DOCUMENTS

| | | | | |
|---|---|---|---|---|
| 6,930,630 B1* | 8/2005 | Kim | ................... | H03M 1/0607 341/143 |
| 7,528,644 B2* | 5/2009 | Choi | ...................... | G01K 7/015 327/512 |
| 7,703,975 B2* | 4/2010 | Kim | ...................... | G01K 7/425 374/170 |
| 8,045,411 B2* | 10/2011 | Kim | ......................... | G11C 7/04 365/203 |

(Continued)

FOREIGN PATENT DOCUMENTS

JP 2012-238363 12/2012

OTHER PUBLICATIONS

Office Action dated Feb. 22, 2018 in corresponding Taiwanese Patent Application No. 106124254 with English translation, 8 pages.

*Primary Examiner* — Son Mai

(74) *Attorney, Agent, or Firm* — Kim & Stewart LLP

(57) ABSTRACT

A semiconductor memory device includes a memory cell array, a temperature sensor that generates a first voltage which is based on a temperature of the semiconductor memory device, compares the first voltage with a second voltage that is based on a result of previous temperature measurement, and generates a voltage generation signal based on a result of comparing the first voltage with the second voltage, and a voltage generating circuit that generates a voltage applied to the memory cell array based on the voltage generation signal.

18 Claims, 10 Drawing Sheets

(56) References Cited

U.S. PATENT DOCUMENTS

| | | | |
|---|---|---|---|
| 8,140,293 B2* | 3/2012 | Jeong | G01K 7/425 |
| | | | 702/117 |
| 8,472,274 B2 | 6/2013 | Fai et al. | |
| 8,570,802 B2 | 10/2013 | Shirakawa | |
| 9,589,599 B2* | 3/2017 | Park | G11C 7/04 |
| 2005/0063120 A1 | 3/2005 | Sinha et al. | |
| 2008/0137460 A1 | 6/2008 | Incarnati et al. | |
| 2012/0014198 A1 | 1/2012 | Kim et al. | |

* cited by examiner

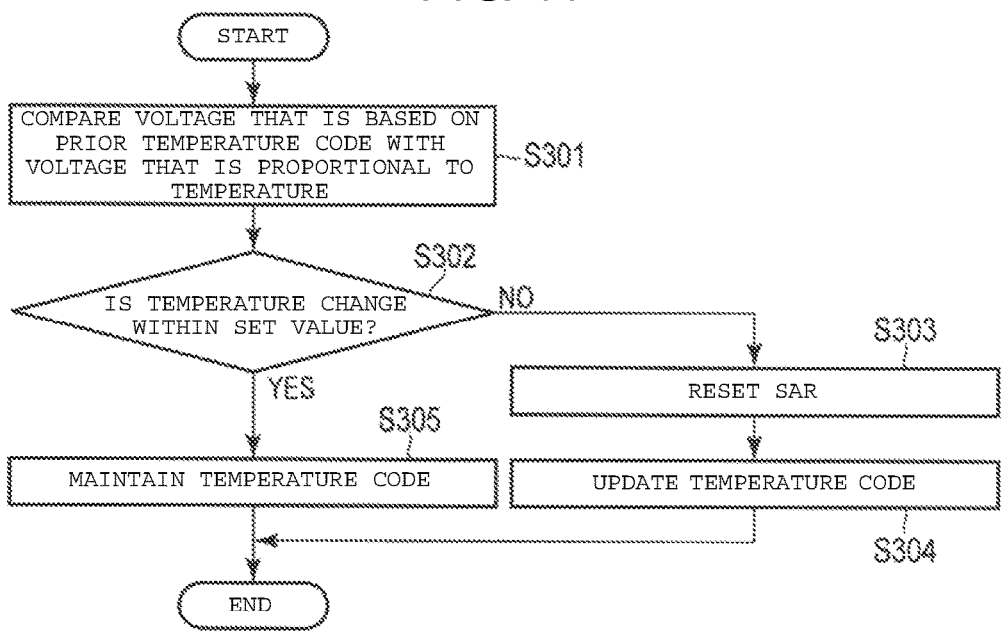

SEMICONDUCTOR MEMORY DEVICE THAT GENERATES VOLTAGES APPLIED TO MEMORY CELLS BASED ON A SIGNAL FROM A TEMPERATURE SENSOR

CROSS-REFERENCE TO RELATED APPLICATION

This application is based upon and claims the benefit of priority from Japanese Patent Application No. 2017-054925, filed Mar. 21, 2017, the entire contents of which are incorporated herein by reference.

FIELD

Embodiments described herein relate generally to a semiconductor memory device.

BACKGROUND

High-speed operations of semiconductor memory devices are desirable.

DESCRIPTION OF THE DRAWINGS

FIG. 11 is a flowchart that illustrates an operation of a temperature sensor of a semiconductor memory device according to a modification of the embodiment.

DETAILED DESCRIPTION

Figure 1:
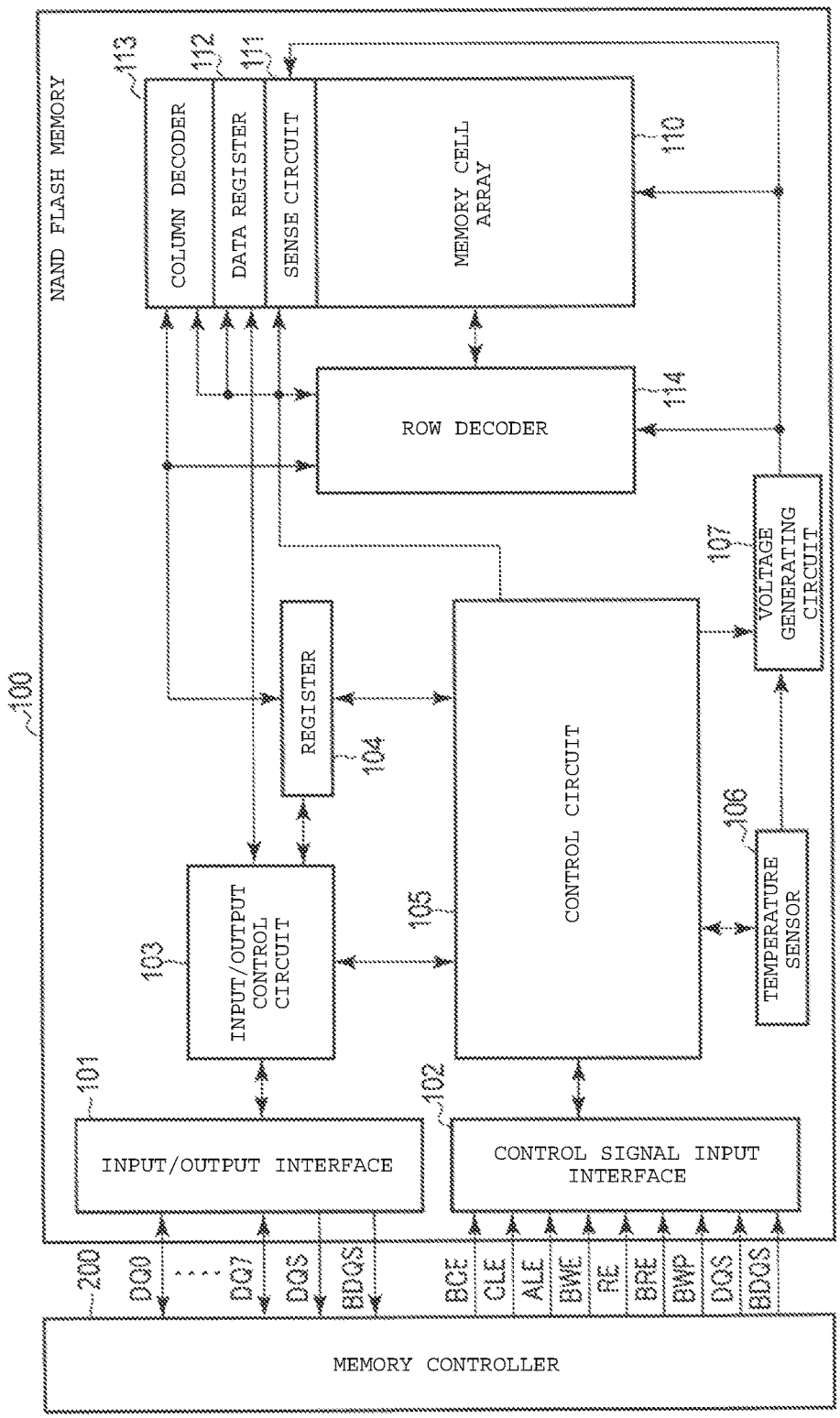
FIG. 1 is a block diagram that illustrates a semiconductor memory device according to an embodiment.

In general, according to one embodiment, a semiconductor memory device includes a memory cell array, a temperature sensor that generates a first voltage that is based on a temperature of the semiconductor memory device, compares the first voltage with a second voltage that is based on a result of previous temperature measurement, and generates a voltage generation signal based on a result of comparing the first voltage with the second voltage, and a voltage generating circuit that generates a voltage applied to the memory cell array based on the voltage generation signal.

Hereinafter, an embodiment will be described with reference to the drawings. In the description, a common reference numeral will be given to common parts in all the drawings.

<1> First Embodiment

A semiconductor memory device according to an embodiment will be described.

<1-1> Configuration

<1-1-1> Configuration of Memory System

The configuration of a memory system including a semiconductor memory device according to the embodiment will be described with reference to FIG. 1.

As illustrated in FIG. 1, a memory system 1 includes an NAND flash memory 100 and a memory controller 200. For example, a combination of the NAND flash memory 100 and the memory controller 200 may form one semiconductor device, and examples thereof include a memory card such as an SD™ card, a solid state drive (SSD), and the like. The memory system 1 may be configured to further include a host device (not illustrated in the drawing).

<1-1-2> Memory Controller

The memory controller 200 outputs a command and the like required for the operation of the NAND flash memory 100 to the NAND flash memory 100. The memory controller 200, by outputting the command to the NAND flash memory 100, performs reading of data from the NAND flash memory 100, writing of data into the NAND flash memory 100, erasing of data stored in the NAND flash memory 100, and the like.

<1-1-3> NAND Flash Memory

The NAND flash memory 100 according to this embodiment will be described with reference to FIG. 1.

The memory controller 200 and the NAND flash memory 100 are connected through an input/output interface 101 and a control signal input interface 102.

The input/output interface 101 generates data strobe signals DQS and BDQS (a complementary signal of DQS) in accordance with a signal supplied from an input/output control circuit 103. When data is output from data input/output lines (DQ0 to DQ7), the input/output interface 101 outputs the data strobe signals DQS and BDQS. Then, the memory controller 200 receives data from the data input/output lines (DQ0 to DQ7) in accordance with the timing of the data strobe signals DQS and BDQS.

In addition, the input/output interface 101, for example, includes a command input terminal, an address input terminal, and the like.

The control signal input interface 102 receives a chip enable signal BCE, a command latch enable signal CLE, an address latch enable signal ALE, a write enable signal BWE, a read enable signal RE, BRE (a complementary signal of the read enable signal RE), a write protect signal BWP, and the data strobe signals DQS and BDQS (a complementary signal of DQS) from the memory controller 200.

The chip enable signal BCE is used as a selection signal of the NAND flash memory 100.

The command latch enable signal CLE is a signal used when an operation command is input into a register 104.

The address latch enable signal ALE is a signal used when address information or input data is input into the register 104.

The write enable signal BWE is a signal used for inputting a command, an address, and data into the input/output interface 101 in the NAND flash memory 100.

The read enable signals RE and BRE are signals used when data is serially output from the input/output interface 101.

The write protect signal BWP is used for protecting data from unexpected erasure or write in a case where an input signal is undetermined at the time of supplying power to the NAND flash memory 100, at the time of disconnecting the power, or the like.

While not illustrated in FIG. 1, an R/B terminal representing the internal operation state of the NAND flash memory 100, Vcc/Vss/Vccq/Vssq terminals used for power supply, and the like are also provided in the NAND flash memory 100.

The input/output control circuit 103 outputs data read from the memory cell array 110 via the input/output interface 101 to the memory controller 200. The input/output control circuit 103 receives various commands such as write, read, erase, and status read, an address, and write data via the control signal input interface 102 and the control circuit 105.

The control circuit 105 supplies a control signal input via the control signal input interface 102 to the input/output control circuit 103.

The control circuit 105 controls a temperature sensor 106, a voltage generating circuit 107, a sense circuit 111, a data register 112, a column decoder 113, a row decoder 114, and a register 104.

The control circuit 105 operates in accordance with a control signal and a command input via the command register 104. The control circuit 105 supplies a desired voltage to the memory cell array 110, the sense circuit 111, and the row decoder 114 by using the voltage generating circuit 107 at the time of programming, verifying, reading, and erasing data.

In this embodiment, the input/output control circuit 103 and the control circuit 105 are described as separate circuits. However, the input/output control circuit 103 and the control circuit 105 may be realized by the same circuit.

The register 104 outputs a command input from the input/output control circuit 103, to the control circuit 105.

The register 104 latches an address, for example, which was supplied from the memory controller 200 through the input/output control circuit 103. Then, the register 104 converts the latched address into an internal physical address (including a column address and a row address). Then, the register 104 supplies the column address to the column decoder 113 and supplies the row address to the row decoder 114.

The register 104 is used for tracking various internal states of the NAND flash memory 100 so that they can be communicated to the outside. The register 104 includes a ready/busy register retaining data representing one of the ready state and the busy state of the NAND flash memory 100, and a write status register (not illustrated) retaining data representing pass/fail of writing.

The temperature sensor 106 measures the temperature of the NAND flash memory 100 based on a command of the control circuit 105 and generates a voltage generation signal that is based on the temperature measurement. The temperature sensor 106 supplies the voltage generation signal to the voltage generating circuit 107. The voltage generating circuit 107 generates various voltages based on the voltage generation signal. The temperature sensor 106 will be described later in detail. The temperature sensor 106 generates the voltage generation signal before an access operation is made on the memory cell array 110, such as a write operation, a read operation, and an erase operation.

The memory cell array 110 includes a plurality of bit lines BL, a plurality of word lines WL, and a source line SL. This memory cell array 110 includes a plurality of blocks BLK in which electrically-rewritable memory cell transistors (also simply referred to as memory cells) MC are arranged in a matrix configuration. Each memory cell transistor MC, for example, includes a stacked gate including a control gate electrode and a charge storage layer (for example, a floating gate electrode), and stores binary data or multi-value data in accordance with a change in the threshold voltage of the memory cell transistor, the change being determined according to an amount of electric charge injected to the floating gate electrode. In addition, the memory cell transistor MC may have a metal-oxide-nitride-oxide-silicon (MONOS) structure in which electrons are trapped in a nitride film.

The configuration of the memory cell array 110 may have other configurations such as the ones described in U.S. patent application Ser. No. 12/407,403 filed on Mar. 19, 2009, entitled "THREE DIMENSIONAL STACKED NON-VOLATILE SEMICONDUCTOR MEMORY," U.S. patent application Ser. No. 12/406,524 filed on Mar. 18, 2009, entitled "THREE DIMENSIONAL STACKED NON-VOLATILE SEMICONDUCTOR MEMORY," U.S. patent application Ser. No. 12/679,991 filed on Mar. 25, 2010, entitled "NON-VOLATILE SEMICONDUCTOR MEMORY DEVICE AND METHOD OF MANUFACTURING THE SAME," U.S. patent application Ser. No. 13/816,799 filed on Sep. 22, 2011, entitled "NONVOLATILE SEMICONDUCTOR MEMORY DEVICE," and U.S. patent application Ser. No. 12/532,030 filed on Mar. 23, 2009, entitled "SEMICONDUCTOR MEMORY AND METHOD FOR MANUFACTURING THE SAME." The entire contents of these patent applications are incorporated herein by reference.

In addition, the configuration of the memory cell array 110 may have the configuration described in U.S. patent application Ser. No. 12/397,711 filed on Mar. 3, 2009, entitled "SEMICONDUCTOR MEMORY DEVICE HAVING PLURALITY OF TYPES OF MEMORIES INTEGRATED ON ONE CHIP," U.S. patent application Ser. No. 13/451,185 filed on Apr. 19, 2012, entitled "SEMICONDUCTOR MEMORY DEVICE INCLUDING STACKED GATE HAVING CHARGE ACCUMULATION LAYER AND CONTROL GATE AND METHOD OF WRITING DATA TO SEMICONDUCTOR MEMORY DEVICE," U.S. patent application Ser. No. 12/405,626 filed on Mar. 17, 2009, entitled "NONVOLATILE SEMICONDUCTOR MEMORY ELEMENT, NONVOLATILE SEMICONDUCTOR MEMORY, AND METHOD FOR OPERATING NONVOLATILE SEMICONDUCTOR MEMORY ELEMENT," and U.S. patent application Ser. No. 09/956,986 filed on Sep. 21, 2001, entitled "NONVOLATILE SEMICONDUCTOR MEMORY DEVICE HAVING ELEMENT ISOLATING REGION OF TRENCH TYPE AND METHOD OF MANUFACTURING THE SAME." The entire contents of these patent applications are also incorporated herein by reference.

When a data reading operation is performed, the sense circuit 111 senses data read into a bit line from the memory cell transistor MC.

The data register 112 includes an SRAM and the like. The data register 112 stores data supplied from the memory controller 200, a verification result detected by the sense circuit 111, and the like.

The column decoder 113 decodes a column address signal and outputs a selection signal used for selecting one of bit lines BL to the sense circuit 111.

The row decoder 114 decodes a row address signal. Then, the row decoder 114 selects and drives a word line WL and select gate lines SGD and SGS of the memory cell array 110.

<1-1-4> Temperature Sensor

Figure 2:
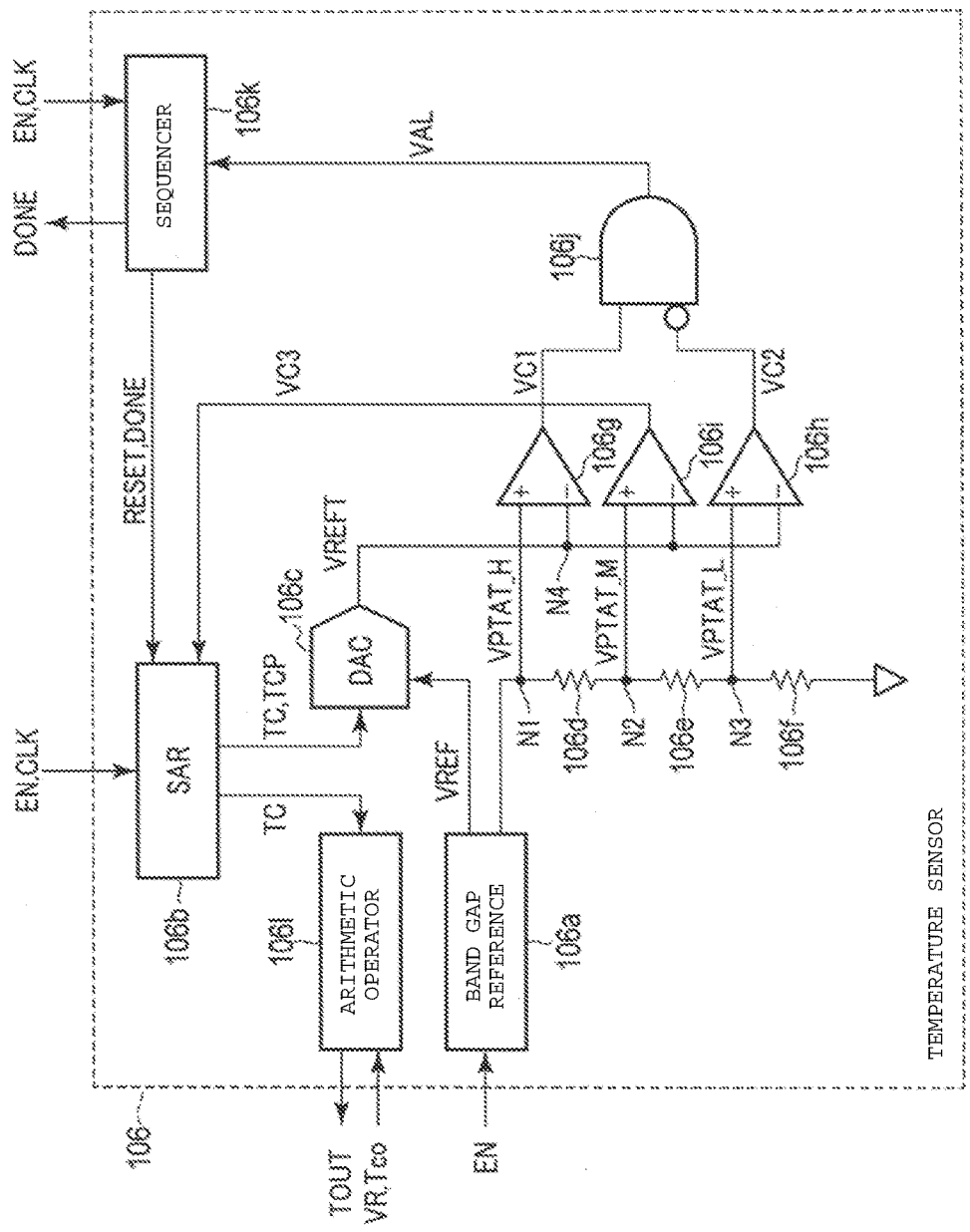
FIG. 2 is a block diagram that illustrates a temperature sensor of the semiconductor memory device according to the embodiment.

Next, the temperature sensor 106 will be described with reference to FIG. 2.

The temperature sensor 106 includes a band gap reference 106a, a successive approximation register (SAR) 106b, a digital-to-analog conversion circuit (DAC) 106c, resistive elements 106d, 106e, and 106f, voltage comparison circuits 106g, 106h, and 106i, an AND operation circuit 106j, a sequencer 106k, and an arithmetic operator circuit 106l.

The band gap reference 106a, for example, includes a diode and the like. Then, when an enable signal EN of a level "H (High)" is received from the control circuit 105, the band gap reference 106a generates a reference voltage VREF and a voltage VPTAT_H that is proportional to the temperature of the NAND flash memory 100. The reference voltage VREF is a voltage that is not proportional to the temperature.

When an enable signal EN of the level "H" is received from the control circuit 105, the successive approximation register 106b operates. In addition, the successive approximation register 106b operates according to the timing (for example, a rising edge) of a clock signal CLK received from the control circuit 105. When an enable signal EN is received from the control circuit 105, the successive approximation register 106b supplies a stored temperature code TC having a digital value, to the digital-to-analog conversion circuit 106c. When a reset signal RESET is received from the sequencer 106k, the successive approximation register 106b performs an updating operation (also referred to as a sampling operation) of the temperature code used for determining a latest temperature code. When a completion notification signal DONE is received from the sequencer 106k or when the sampling operation is completed, the successive approximation register 106b supplies the stored temperature code TC to the arithmetic operator circuit 106l. The successive approximation register 106b basically stores the latest temperature code TC.

The digital-to-analog conversion circuit 106c converts the temperature code TC into a voltage. More specifically, the digital-to-analog conversion circuit 106c generates a second reference voltage VREFT based on the reference voltage VREF and the temperature code TC. The second reference voltage VREFT is a voltage that is not proportional to the temperature but is proportional to the temperature code TC.

The voltage comparison circuit 106g has a non-inverted terminal to which the voltage VPTAT_H is supplied via a node N1 and has an inverted terminal to which the voltage VREFT is supplied via a node N4. In a case where the voltage VPTAT_H is higher than the voltage VREFT, the voltage comparison circuit 106g outputs a signal VC1 of the level "H". On the other hand, in a case where the voltage VPTAT_H is lower than the voltage VREFT, the voltage comparison circuit 106g outputs the signal VC1 of a level "L (Low)" (L<H).

The resistive element 106d has one end to which the node N1 is connected and the other end to which a node N2 is connected. A resistance value of the resistive element 106d and the like will be described later.

The voltage comparison circuit 106i has a non-inverted terminal to which a voltage VPTAT_M (VPTAT_M<VPTAT_H) is supplied via the node N2 and has an inverted terminal to which the voltage VREFT is supplied via the node N4. In a case where the voltage VPTAT_M is higher than the voltage VREFT, the voltage comparison circuit 106i outputs a signal VC3 of the level "H". On the other hand, in a case where the voltage VPTAT_M is lower than the voltage VREFT, the voltage comparison circuit 106i outputs the signal VC3 of the level "L".

The resistive element 106e has one end to which the node N2 is connected and the other end to which the node N3 is connected. The resistance value of the resistive element 106e and the like will be described later.

The voltage comparison circuit 106h has a non-inverted terminal to which the voltage VPTAT_L (VPTAT_L<VPTAT_M) is supplied via the node N3 and an inverted terminal to which the voltage VREFT is supplied via the node N4. In a case where the voltage VPTAT_L is higher than the voltage VREFT, the voltage comparison circuit 106h outputs the signal VC2 of the level "H". On the other hand, in a case where the voltage VPTAT_L is lower than the voltage VREFT, the voltage comparison circuit 106h outputs the signal VC2 of the level "L".

The resistive element 106f has one end to which the node N3 is connected and the other end to which the ground potential VSS is connected.

The AND operation circuit 106j has a non-inverted terminal to which the signal VC1 is input and an inverted terminal to which the signal VC2 is input. The AND operation circuit 106j outputs a signal VAL of the level "H" only in a case where the signal VC1 is the level "H", and the signal VC2 is the level "L" and outputs the signal VAL of the level "L" in the other cases.

When an enable signal EN of the level "H" is received from the control circuit 105, the sequencer 106k operates. In addition, the sequencer 106k operates according to the timing (for example, a rising edge) of the clock signal CLK received from the control circuit 105. When the signal VAL of the level "H" is received, the sequencer 106k supplies a completion notification signal DONE to the control circuit 105. On the other hand, when the signal VAL of the level "L" is received, the sequencer 106k supplies a reset signal RESET to the successive approximation register 106b.

The arithmetic operator circuit 106l generates a voltage generation signal TOUT based on the temperature code TC supplied from the successive approximation register 106b, a voltage code VR, and a temperature coefficient Tco. The arithmetic operator circuit 106l derives the voltage generation signal TOUT by using an equation of "voltage generation signal TOUT=voltage code VR+temperature coefficient Tco*temperature code TC".

<1-1-5> Temperature Code

Next, the temperature code will be described with reference to FIG. 3.

The temperature sensor 106 converts the temperature of the NAND flash memory 100 into digital data of n bits (here, n is an arbitrary integer). This digital data is the temperature code.

Here, as an example, a case will be described in which the temperature code is digital data of five bits.

Figure 3:
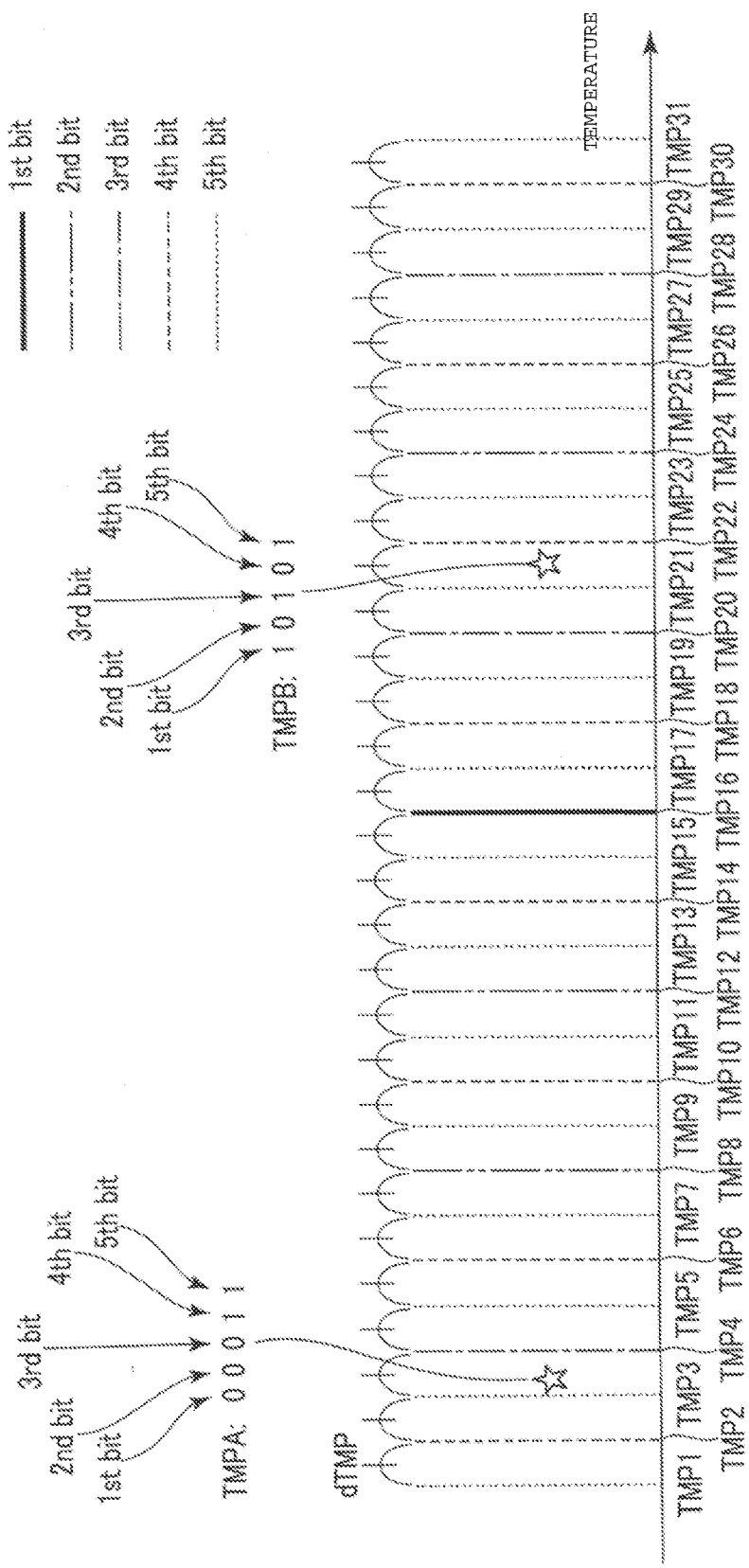
FIG. 3 is a diagram that illustrates temperature codes of the semiconductor memory device according to the embodiment.

In the case where the temperature code is digital data of five bits, as illustrated in FIG. 3, the temperature can be divided into 32 for a determination.

A first bit is a bit used for determining the temperature to be higher/lower than a temperature TMP16. For example, in a case where the temperature of the NAND flash memory 100 is lower than the temperature TMP16, the first bit is "0". On the other hand, in a case where the temperature of the NAND flash memory 100 is higher than the temperature TMP16, the first bit is "1".

A second bit is a bit used for determining the temperature to be higher/lower than a temperature TMP8 or a temperature TMP24. For example, in a case where the temperature of the NAND flash memory 100 is lower than the temperature TMP8 or the temperature TMP24, the second bit is "0". On the other hand, in a case where the temperature of the NAND flash memory 100 is higher than the temperature TMP8 or the temperature TMP24, the second bit is "1".

A third bit is a bit used for determining the temperature to be higher/lower than one temperature selected from among a temperature TMP4, a temperature TMP12, a temperature TMP20, and a temperature TMP28. For example, in a case where the temperature of the NAND flash memory 100 is lower than one temperature selected from among the temperature TMP4, the temperature TMP12, the temperature TMP20, and the temperature TMP28, the third bit is "0". On the other hand, in a case where the temperature of the NAND flash memory 100 is higher than one temperature selected from among the temperature TMP4, the temperature TMP12, the temperature TMP20, and the temperature TMP28, the third bit is "1".

A fourth bit is a bit used for determining the temperature to be higher/lower than one temperature selected from among a temperature TMP2, a temperature TMP6, a temperature TMP10, a temperature T14, a temperature TMP18, a temperature TMP22, a temperature TMP26, and a temperature TMP30. For example, in a case where the temperature of the NAND flash memory 100 is lower than one temperature selected from among the temperature TMP2, the temperature TMP6, the temperature TMP10, the temperature TMP14, the temperature TMP18, the temperature TMP22, the temperature TMP26, and the temperature TMP30, the fourth bit is "0". On the other hand, in a case where the temperature of the NAND flash memory 100 is higher than one temperature selected from among the temperature TMP2, the temperature TMP6, the temperature TMP10, the temperature TMP14, the temperature TMP18, the temperature TMP22, the temperature TMP26, and the temperature TMP30, the fourth bit is "1".

A fifth bit is a bit used for determining the temperature to be higher/lower than one temperature selected from among a temperature TMP1, a temperature TMP3, a temperature TMP5, a temperature TMP7, a temperature TMP9, a temperature TMP11, a temperature TMP13, a temperature TMP15, a temperature TMP17, a temperature TMP19, a temperature TMP21, a temperature TMP23, a temperature TMP25, a temperature TMP27, a temperature TMP29, and a temperature TMP31. For example, in a case where the temperature of the NAND flash memory 100 is lower than one temperature selected from among the temperature TMP1, the temperature TMP3, the temperature TMP5, the temperature TMP7, the temperature TMP9, the temperature TMP11, the temperature TMP13, the temperature TMP15, the temperature TMP17, the temperature TMP19, the temperature TMP21, the temperature TMP23, the temperature TMP25, the temperature TMP27, the temperature TMP29, and the temperature TMP31, the fifth bit is "0". On the other hand, in a case where the temperature of the NAND flash memory 100 is higher than one temperature selected from among the temperature TMP1, the temperature TMP3, the temperature TMP5, the temperature TMP7, the temperature TMP9, the temperature TMP11, the temperature TMP13, the temperature TMP15, the temperature TMP17, the temperature TMP19, the temperature TMP21, the temperature TMP23, the temperature TMP25, the temperature TMP27, the temperature TMP29, and the temperature TMP31, the fifth bit is "1".

In addition, the voltage changes in proportion to the temperature of the NAND flash memory 100. Thus, the temperature sensor 106 of the semiconductor memory device according to this embodiment described above determines a temperature based on the voltage changing according to the temperature.

A sampling operation method when the temperature of the NAND flash memory 100 is a temperature TMPA will be schematically described with reference to FIG. 3. When the sampling operation is performed, the successive approximation register 106b generates a voltage that is based on the temperature TMP16 in the digital-to-analog conversion circuit 106c. As illustrated in FIG. 3, the temperature TMPA is lower than the temperature TMP16. For this reason, the signal VC3 of the level "L" is supplied to the successive approximation register 106b. Accordingly, the successive approximation register 106b determines the first bit to be "0". Since the first bit is determined to be "0", the successive approximation register 106b compares the temperature TMPA with the temperature TMP8. The temperature TMPA is lower than the temperature TMP8. For this reason, the successive approximation register 106b determines the second bit to be "0". Since the first bit and the second bit are determined to be "0", the successive approximation register 106b compares the temperature TMPA with the temperature TMP4. The temperature TMPA is lower than the temperature TMP4. For this reason, the successive approximation register 106b determines the third bit to be "0". Since the first to third bits are determined to be "0", the successive approximation register 106b compares the temperature TMPA with the temperature TMP2. The temperature TMPA is higher than the temperature TMP2. For this reason, the successive approximation register 106b determines the fourth bit to be "1". Since the first to third bits are determined to be "0", and the fourth bit is determined to be "1", the successive approximation register 106b compares the temperature TMPA with the temperature TMP3. The temperature TMPA is higher than the temperature TMP3. For this reason, the successive approximation register 106b determines the fifth bit to be "1". In this way described above, the successive approximation register 106b determines that the temperature TMPA is between the temperature TMP3 and the temperature TMP4, and, as a result of the determination, a digital code "00011" can be acquired.

As a further specific example, a sampling operation method when the temperature of the NAND flash memory 100 is a temperature TMPB will be described. The temperature TMPB is higher than the temperature TMP16. For this reason, the successive approximation register 106b determines the first bit to be "1". Since the first bit is determined to be "1", the successive approximation register 106b compares the temperature TMPB with the temperature TMP24. The temperature TMPB is lower than the temperature TMP24. For this reason, the successive approximation register 106b determines the second bit to be "0". Since the first bit is determined to be "1", and the second bit is determined to be "0", the successive approximation register 106b compares the temperature TMPB with the temperature TMP20. The temperature TMPB is higher than the temperature TMP20. For this reason, the successive approximation register 106b determines the third bit to be "1". Since the first bit and the third bit are determined to be "1", and the second bit is determined to be "0", the successive approximation register 106b compares the temperature TMPB with the temperature TMP22. The temperature TMPB is lower than the temperature TMP22. For this reason, the successive approximation register 106b determines the fourth bit to be "0". Since the first bit and the third bit are determined to be "1", and the second bit and the fourth bit are determined to be "0", the successive approximation register 106b compares the temperature TMPB with the temperature TMP21. The temperature TMPB is higher than the temperature TMP21. For this reason, the successive approximation register 106b determines the fifth bit to be "1". In this way described above, the successive approximation register 106b determines that the temperature TMPB is between the temperature TMP21 and the temperature TMP22, and, as a result of the determination, a digital code "10101" can be acquired.

The temperatures TMP1 to TMP31 are respectively set to have an equal gap (dTMP).

<1-2> Operation

<1-2-1> Operation of Temperature Sensor

Figure 4:
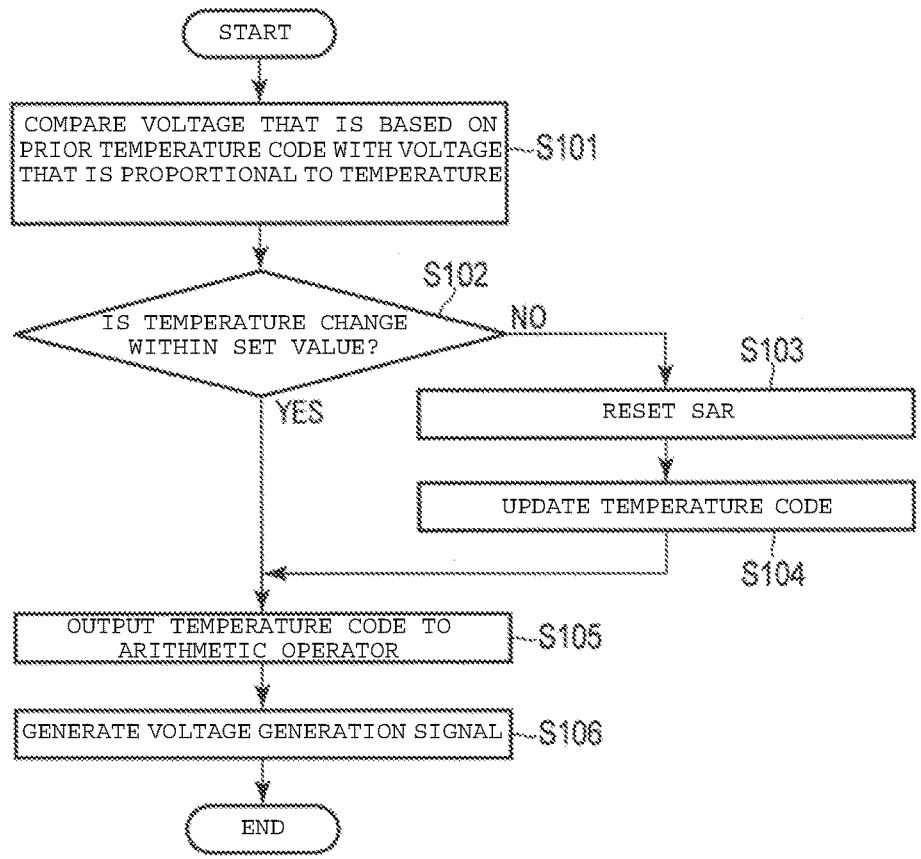
FIG. 4 is a flowchart that illustrates an operation of the temperature sensor of the semiconductor memory device according to the embodiment.

The operation of the temperature sensor 106 of the semiconductor memory device according to this embodiment will be described with reference to FIG. 4.

[Step S101]

The band gap reference 106a and the successive approximation register 106b wait until an enable signal EN of the level "H" is received.

When the enable signal EN of the level "H" is received, the temperature sensor 106 performs a "temperature measurement operation" for determining whether or not the temperature of the NAND flash memory 100 corresponds to a latest temperature code TC. When this temperature measurement operation is performed, a sampling operation is not performed.

When an enable signal EN of the level "H" is received, the band gap reference 106a generates a reference voltage VREF and a voltage VPTAT_H.

When an enable signal EN of the level "H" is received, the successive approximation register 106b supplies the stored temperature code TC to the digital-to-analog conversion circuit 106c. This temperature code TC is a latest temperature code TC.

When the reference voltage VREF and the temperature code TC are received, the digital-to-analog conversion circuit 106c generates a reference voltage VREFT corresponding to the temperature code TC.

The voltage VPTAT_H is supplied to the node N1, and the voltage VPTAT_L is supplied to the node N3.

In this embodiment, the voltage VPTAT_H that is proportional to the temperature of the NAND flash memory 100 is intentionally lowered using a resistive element 106d and a resistive element 106e, and the voltage VPTAT_L is generated. Accordingly, to be pseudo, the voltage VPTAT_H becomes a voltage corresponding to a temperature TMPX+1 (here, X is an arbitrary integer), and the voltage VPTAT_L becomes a voltage corresponding to the temperature TMPX. In other words, by adjusting the resistance values of the resistive element 106d and the resistive element 106e, the temperature TMPX and the temperature TMPX+1 can be adjusted. More specifically, by decreasing the resistance value of the resistive element 106d and the resistive element 106e, a gap dTMP between the temperature TMPX and the temperature TMPX+1 is narrowed. On the other hand, by increasing the resistance value of the resistive element 106d and the resistive element 106e, a gap dTMP between the temperature TMPX and the temperature TMPX+1 is broadened.

The voltage comparison circuit 106g compares the voltage VPTAT_H with the reference voltage VREFT. The voltage comparison circuit 106h compares the voltage VPTAT_L with the reference voltage VREFT. By performing the comparison, the temperature sensor 106 can determine whether a temperature that is based on the latest temperature code TC is between the temperature TMPX and the temperature TMPX+1.

[Step S102]

In a case where the voltage VPTAT_H is higher than the reference voltage VREFT, and the voltage VPTAT_L is lower than the reference voltage VREFT, the sequencer 106k can determine that the temperature of the NAND flash memory 100 at the current time point is between the temperature TMPX and the temperature TMPX+1. In other words, the temperature of the NAND flash memory 100 at the current time point can be regarded to be the same as latest temperature information.

On the other hand, in a case where the voltage VPTAT_H is higher than the reference voltage VREFT, and the voltage VPTAT_L is higher than the reference voltage VREFT or in a case where the voltage VPTAT_H is lower than the reference voltage VREFT, and the voltage VPTAT_L is lower than the reference voltage VREFT, the sequencer 106k can determine that the temperature of the NAND flash memory 100 at the current time point is not present between the temperature TMPX and the temperature TMPX+1. In other words, the temperature of the NAND flash memory 100 at the current time point cannot be regarded to be the same as the latest temperature information.

Hereinafter, a specific operation will be described. In a case where the voltage comparison circuit 106g outputs the signal VC1 of the level "H", and the voltage comparison circuit 106h outputs the signal VC2 of the level "L", the AND operation circuit 106j supplies a signal of the level "H" to the sequencer 106k. Accordingly, the sequencer 106k determines that the temperature code TC stored in the successive approximation register 106b in Step S101 represents that "a temperature change is within a set value (gap dTMP)".

In a case where the voltage comparison circuit 106g outputs the signal VC1 of the level "H", and the voltage comparison circuit 106h outputs the signal VC2 of the level "H" or in a case where the voltage comparison circuit 106g outputs the signal VC1 of the level "L", and the voltage comparison circuit 106h outputs the signal VC2 of the level "L", the AND operation circuit 106j supplies a signal of the level "L" to the sequencer 106k. Accordingly, the sequencer 106k determines that the temperature code TC stored in the successive approximation register 106b in Step S101 does not represent that "a temperature change is within a set value".

[Step S103]

In a case where the temperature code TC represents that the condition "a temperature change is within a set value" is not met (Step S102: No), the sequencer 106k supplies a reset signal RESET to the successive approximation register 106b. When the reset signal RESET is received, the successive approximation register 106b resets (e.g., updates by overwriting) the stored temperature code TC.

[Step S104]

When the temperature code TC is reset, the successive approximation register 106b starts the sampling operation of the temperature code TC. The sampling operation will be described later in detail.

[Step S105]

In a case where that it is determined that the temperature code TC represents that the condition "a temperature change is within the set value" is met (Step S102: Yes), the sequencer 106k supplies a completion notification signal DONE to the successive approximation register 106b. When the completion notification signal DONE is received, the successive approximation register 106b supplies the stored temperature code TC to the arithmetic operator circuit 106l.

Alternatively, when the sampling operation is completed, the successive approximation register 106b supplies the updated temperature code TC to the arithmetic operator circuit 106l.

[Step S106]

The arithmetic operator circuit 106l generates a voltage generation signal TOUT based on the received temperature code TC.

As above, the temperature sensor 106 measures the temperature of the NAND flash memory 100 and performs control on the voltage generating circuit 107 to generate a voltage according to the temperature.

<1-2-2> Sampling Operation

Figure 5:
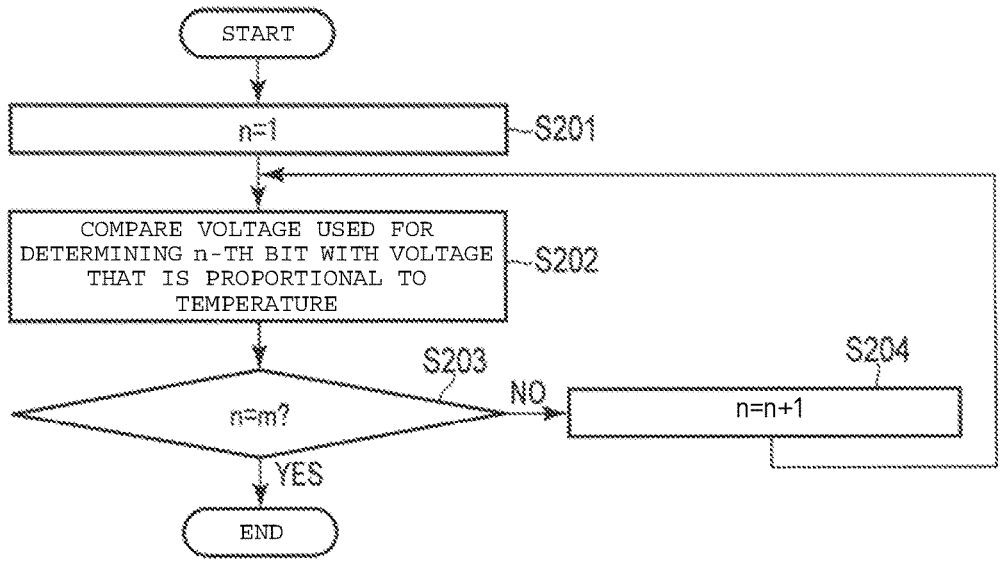
FIG. 5 is a flowchart that illustrates a sampling operation of the semiconductor memory device according to the embodiment.

Next, the sampling operation of Step S104 will be described with reference to FIG. 5.

[Step S201]

In a case where a temperature code of m bits (here, m is an arbitrary integer) is generated, the successive approximation register 106b performs a determination relating to the n-th bit (here, n is an arbitrary integer) m times. The successive approximation register 106b, first, determines the first bit and thus, sets n=1.

[Step S202]

The successive approximation register 106b outputs a provisional temperature code TCP used for determining the n-th bit. The digital-to-analog conversion circuit 106c generates a voltage VREFT based on the provisional temperature code TCP. The voltage VREFT is a voltage that is proportional to the provisional temperature code TCP. The provisional temperature code TCP represents temperature TMP16 for n=1 and is changed for n=2, 3, 4, and 5 to represent another temperature in accordance with the technique described above in conjunction with FIG. 3.

The voltage comparison circuit 106i compares the voltage VREFT used for determining the n-th bit with the voltage VPTAT_M that is proportional to the temperature. In this example, the voltage VPTAT_M is treated as a voltage corresponding to the temperature of the NAND flash memory 100.

When the signal VC3 that is a result of the comparison is received from the voltage comparison circuit 106i, the successive approximation register 106b finalizes the n-th bit data.

[Step S203]

The successive approximation register 106b determines whether or not n is m. This m corresponds to "5" of "five bits" described with reference to FIG. 3. This m may be stored in the successive approximation register 106b or may be stored in another memory area (for example, the register 104).

In a case where it is determined that n is m (Step S203: Yes), the successive approximation register 106b ends the sampling operation.

[Step S204]

On the other hand, in a case where it is determined that n is not m (Step S203: No), the successive approximation register 106b increments n by one. Thereafter, Step S202 is repeated.

<1-2-3> Specific Example 1

Next, a specific example of a case where the sequencer 106k determines that the temperature code TC represents that the condition "a temperature change is within the set value" is met (Step S102: Yes) will be described with reference to FIG. 6.

[Time T1]

In a case where the voltage generating circuit 107 is caused to generate a voltage, the control circuit 105 supplies an enable signal EN of the level "H" to the temperature sensor 106.

When an enable signal EN of the level "H" is received, the band gap reference 106a generates a reference voltage VREF and a voltage VPTAT_H.

[Time T2]

At time T2, when the reference voltage VREF sufficiently rises, a clock signal CLK is input to the temperature sensor 106 from the control circuit 105.

The successive approximation register 106b receives the enable signal EN of the level "H" and, in a case where the clock signal CLK rises, supplies the stored temperature code TC to the digital-to-analog conversion circuit 106c.

When the reference voltage VREF and the temperature code TC are received, the digital-to-analog conversion circuit 106c generates a reference voltage VREFT corresponding to the temperature code TC.

The voltage VPTAT_H is supplied to the node N1, the voltage VPTAT_M is supplied to the node N2, and the voltage VPTAT_L is supplied to the node N3.

The voltage comparison circuit 106g compares the voltage VPTAT_H with the reference voltage VREFT. The voltage comparison circuit 106h compares the voltage VPTAT_L with the reference voltage VREFT.

As described above, this example is an example in which the temperature code TC represents that "a temperature change is within the set value". For this reason, the voltage VPTAT_H is higher than the reference voltage VREFT, and the voltage VPTAT_L is lower than the reference voltage VREFT.

[Time T3]

The voltage comparison circuit 106g outputs a signal VC1 of the level "H" as a result of the comparison. The voltage comparison circuit 106h outputs a signal VC2 of the level "L" as a result of the comparison.

In Step S101, the process is performed regardless of the level of the signal VC3.

[Time T4]

The AND operation circuit 106j outputs a signal VAL of the level "H" based on the signal VC1 of the level "H" and the signal VC2 of the level "L".

[Time T5]

The sequencer 106k supplies a completion notification signal DONE of the level "H" to the control circuit 105 and the successive approximation register 106b based on the signal VAL of the level "H".

When the completion notification signal DONE of the level "H" is received, the successive approximation register 106b supplies the temperature code TC to the arithmetic operator circuit 106l.

When the completion notification signal DONE of the level "H" is received, the control circuit 105 causes the enable signal EN to fall to the level "L".

[Time T6]

The arithmetic operator circuit 106*l* generates a voltage generation signal TOUT based on the temperature code TC and outputs the generated voltage generation signal TOUT to the voltage generating circuit 107.

As above, in a case where the temperature code TC represents that "a temperature change is within the set value", the setting of the temperature code TC can be performed in at least two clocks.

<1-2-4> Specific Example 2

Figure 7:
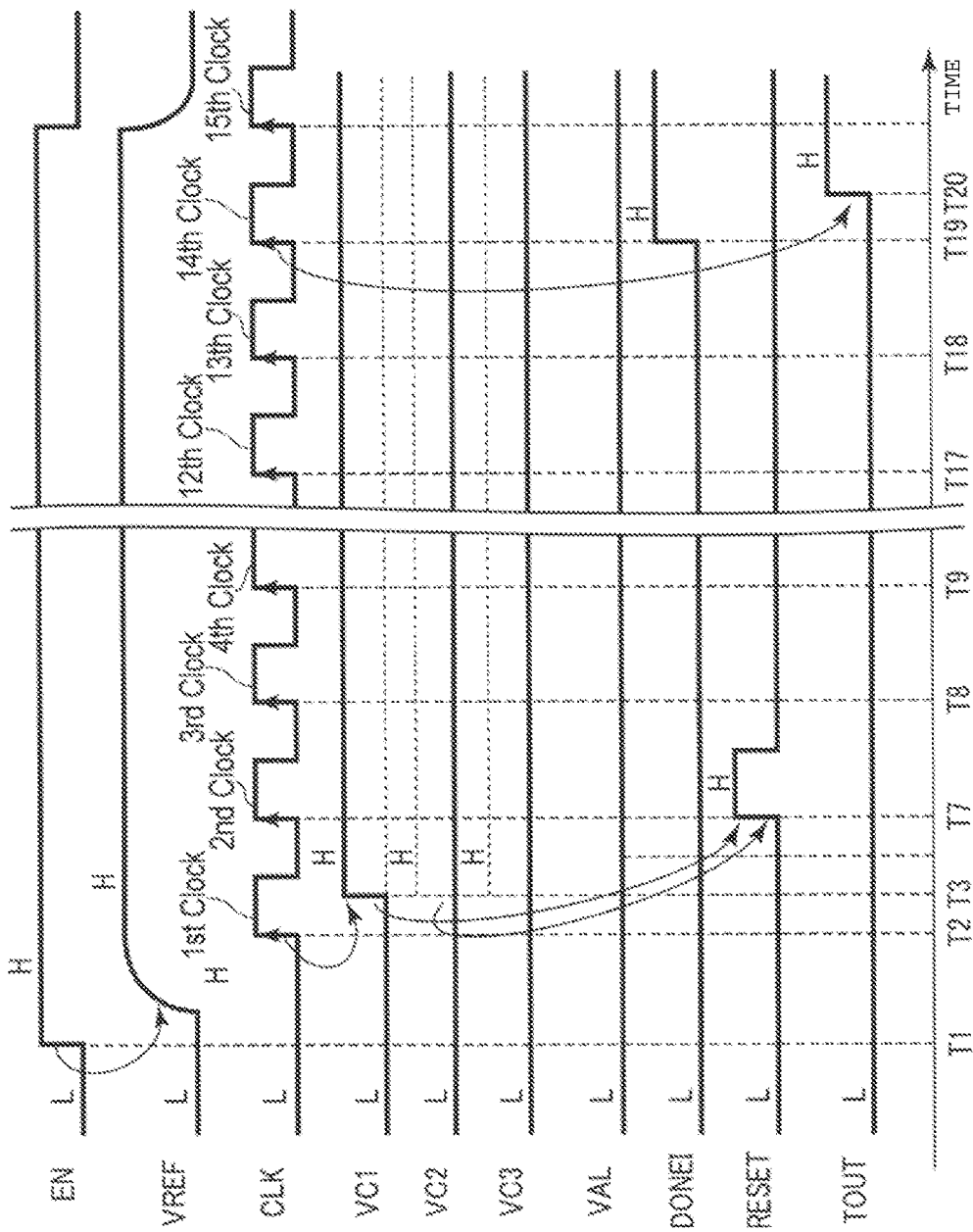
FIG. 7 is a waveform diagram illustrating a specific example of a case where the sequencer of the semiconductor memory device according to the embodiment determines that a temperature code does not represent that "a temperature change is within a set value"

Next, a specific example of a case where the sequencer 106*k* determines that the temperature code TC does not represent that "a temperature change is within the set value" (Step S102: No) will be described with reference to FIG. 7.

[Time T1]

Figure 6:
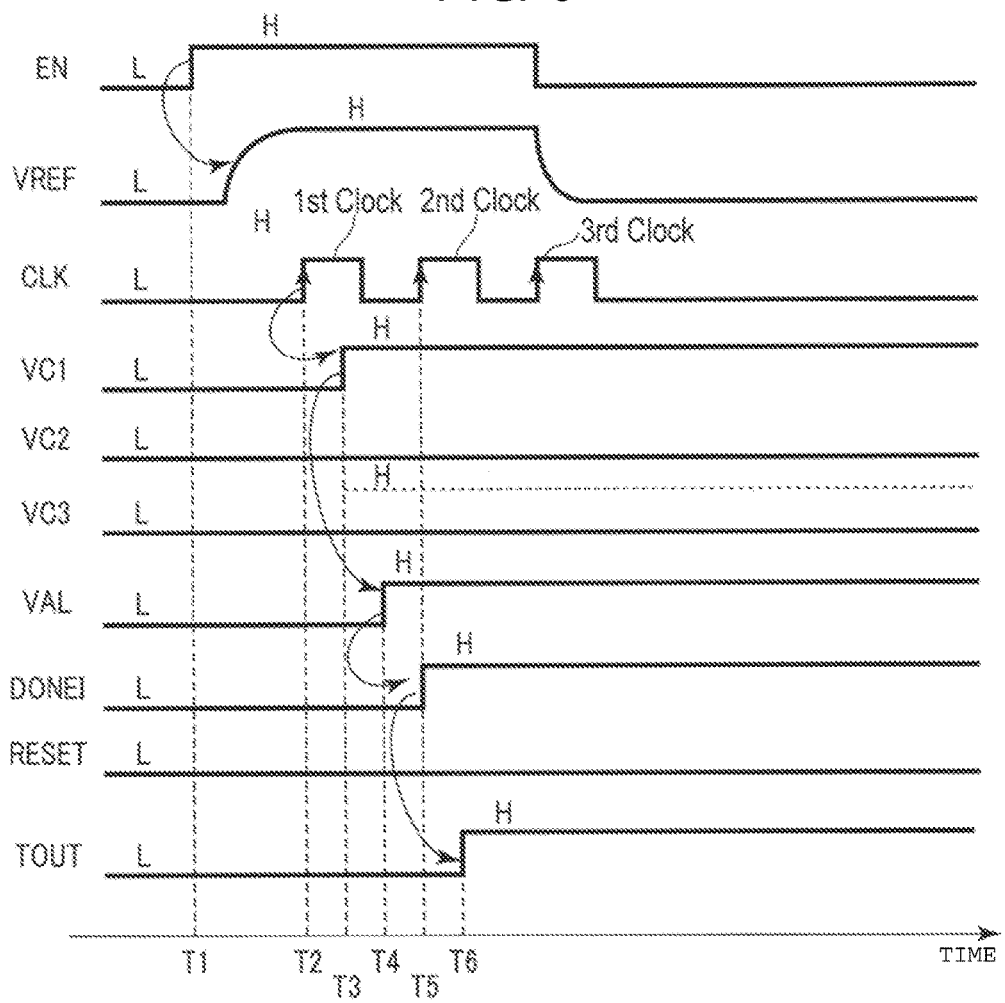
FIG. 6 is a waveform diagram illustrating a specific example of a case where a sequencer of the semiconductor memory device according to the embodiment determines that a temperature code represents that "a temperature change is within a set value"

The NAND flash memory 100 performs an operation similar to the operation relating to time T1 described with reference to FIG. 6.

[Time T2]

The NAND flash memory 100 performs an operation similar to the operation relating to time T2 described with reference to FIG. 6.

However, as described above, this example is an example in which the temperature code TC does not represent that "a temperature change is within the set value". For this reason, the voltage VPTAT_H is higher than the reference voltage VREFT, and the voltage VPTAT_L is higher than the reference voltage VREFT. Alternatively, the voltage VPTAT_H is lower than the reference voltage VREFT, and the voltage VPTAT_L is lower than the reference voltage VREFT.

[Time T3]

In a case where the voltage VPTAT_H is higher than the reference voltage VREFT, and the voltage VPTAT_L is higher than the reference voltage VREFT, the voltage comparison circuit 106*g* outputs a signal VC1 of the level "H" as a result of the comparison. In addition, the voltage comparison circuit 106*h* outputs a signal VC2 of the level "H" as a result of the comparison.

In a case where the voltage VPTAT_H is lower than the reference voltage VREFT, and the voltage VPTAT_L is lower than the reference voltage VREFT, the voltage comparison circuit 106*g* outputs a signal VC1 of the level "L" as a result of the comparison. In addition, the voltage comparison circuit 106*h* outputs a signal VC2 of the level "L" as a result of the comparison.

In Step S101, the process is performed regardless of the level of the signal VC3.

[Time T7]

The AND operation circuit 106*j* outputs a signal VAL of the level "L" based on the signal VC1 of the level "H" and the signal VC2 of the level "H" or the signal VC1 of the level "L" and the signal VC2 of the level "L".

[Time T8]

The sequencer 106*k* supplies a reset signal RESET of the level "H" to the successive approximation register 106*b* based on the signal VAL of the level "L".

When the reset signal RESET of the level "H" is received, the successive approximation register 106*b* resets the stored temperature code TC.

[Time T9]

After resetting the temperature code TC, the successive approximation register 106*b* starts a sampling operation. Here, for the simplification of description, a case where the temperature code TC is digital data of five bits will be described.

More specifically, the successive approximation register 106*b* supplies a provisional temperature code TCP used for determining data of the first bit to the digital-to-analog conversion circuit 106*c*.

The digital-to-analog conversion circuit 106*c* generates a reference voltage VREFT based on the provisional temperature code TCP.

The voltage comparison circuit 106*i* compares the voltage VPTAT_M with the reference voltage VREFT. Then, the voltage comparison circuit 106*i* outputs a result of the comparison as a signal VC3.

[Time T10]

The successive approximation register 106*b* stores the signal VC3 at the time point of time T10 as a digital value of the first bit.

[Time T11]

After finalizing the first bit, the successive approximation register 106*b* supplies a provisional temperature code TCP used for determining data of the second bit to the digital-to-analog conversion circuit 106*c*.

The digital-to-analog conversion circuit 106*c* generates a reference voltage VREFT based on the provisional temperature code TCP.

The voltage comparison circuit 106*i* compares the voltage VPTAT_M with the reference voltage VREFT. Then, the voltage comparison circuit 106*i* outputs a result of the comparison as a signal VC3.

[Time T12]

The successive approximation register 106*b* stores the signal VC3 at the time point of time T12 as a digital value of the second bit.

[Time T13]

After finalizing the second bit, the successive approximation register 106*b* supplies a provisional temperature code TCP used for determining data of the third bit to the digital-to-analog conversion circuit 106*c*.

The digital-to-analog conversion circuit 106*c* generates a reference voltage VREFT based on the provisional temperature code TCP.

The voltage comparison circuit 106*i* compares the voltage VPTAT_M with the reference voltage VREFT. Then, the voltage comparison circuit 106*i* outputs a result of the comparison as a signal VC3.

[Time T14]

The successive approximation register 106*b* stores the signal VC3 at the time point of time T14 as a digital value of the third bit.

[Time T15]

After finalizing the third bit, the successive approximation register 106*b* supplies a provisional temperature code TCP used for determining data of the fourth bit to the digital-to-analog conversion circuit 106*c*.

The digital-to-analog conversion circuit 106*c* generates a reference voltage VREFT based on the provisional temperature code TCP.

The voltage comparison circuit 106*i* compares the voltage VPTAT_M with the reference voltage VREFT. Then, the voltage comparison circuit 106*i* outputs a result of the comparison as a signal VC3.

[Time T16]

The successive approximation register 106*b* stores the signal VC3 at the time point of time T16 as a digital value of the fourth bit.

[Time T17]

After finalizing the fourth bit, the successive approximation register 106*b* supplies a provisional temperature code TCP used for determining data of the fifth bit to the digital-to-analog conversion circuit 106c.

The digital-to-analog conversion circuit 106c generates a reference voltage VREFT based on the provisional temperature code TCP.

The voltage comparison circuit 106i compares the voltage VPTAT_M with the reference voltage VREFT. Then, the voltage comparison circuit 106i outputs a result of the comparison as a signal VC3.

[Time T18]

The successive approximation register 106b stores the signal VC3 at the time point of time T18 as a digital value of the fifth bit.

[Time T19]

After finalizing the temperature code, the successive approximation register 106b supplies the temperature code TC to the arithmetic operator circuit 106l.

After the successive approximation register 106b finalizes the temperature code, the sequencer 106k supplies a completion notification signal DONE of the level "H" to the control circuit 105.

When the completion notification signal DONE of the level "H" is received, the control circuit 105 causes the enable signal EN to fall to the level "L".

[Time T20]

The arithmetic operator circuit 106l generates a voltage generation signal TOUT based on the temperature code TC and outputs the generated voltage generation signal TOUT to the voltage generating circuit 107.

<1-3> Effects

According to the embodiment described above, it is determined whether or not the previous temperature of the NAND flash memory 100 changes over the predetermined value (dTMP) by using the resistive element 106d, the resistive element 106e, the voltage comparison circuit 106g, the voltage comparison circuit 106h, and the AND operation circuit 106j.

In this way, the number of times of performing the sampling operation can be reduced, and the semiconductor memory device can be operated at a higher speed.

To facilitate the understanding of the effects of the embodiment described above, Comparative Example 1 and Comparative Example 2 will be described.

First, Comparative Example 1 will be described with reference to FIGS. 8 and 9.

Figure 8:
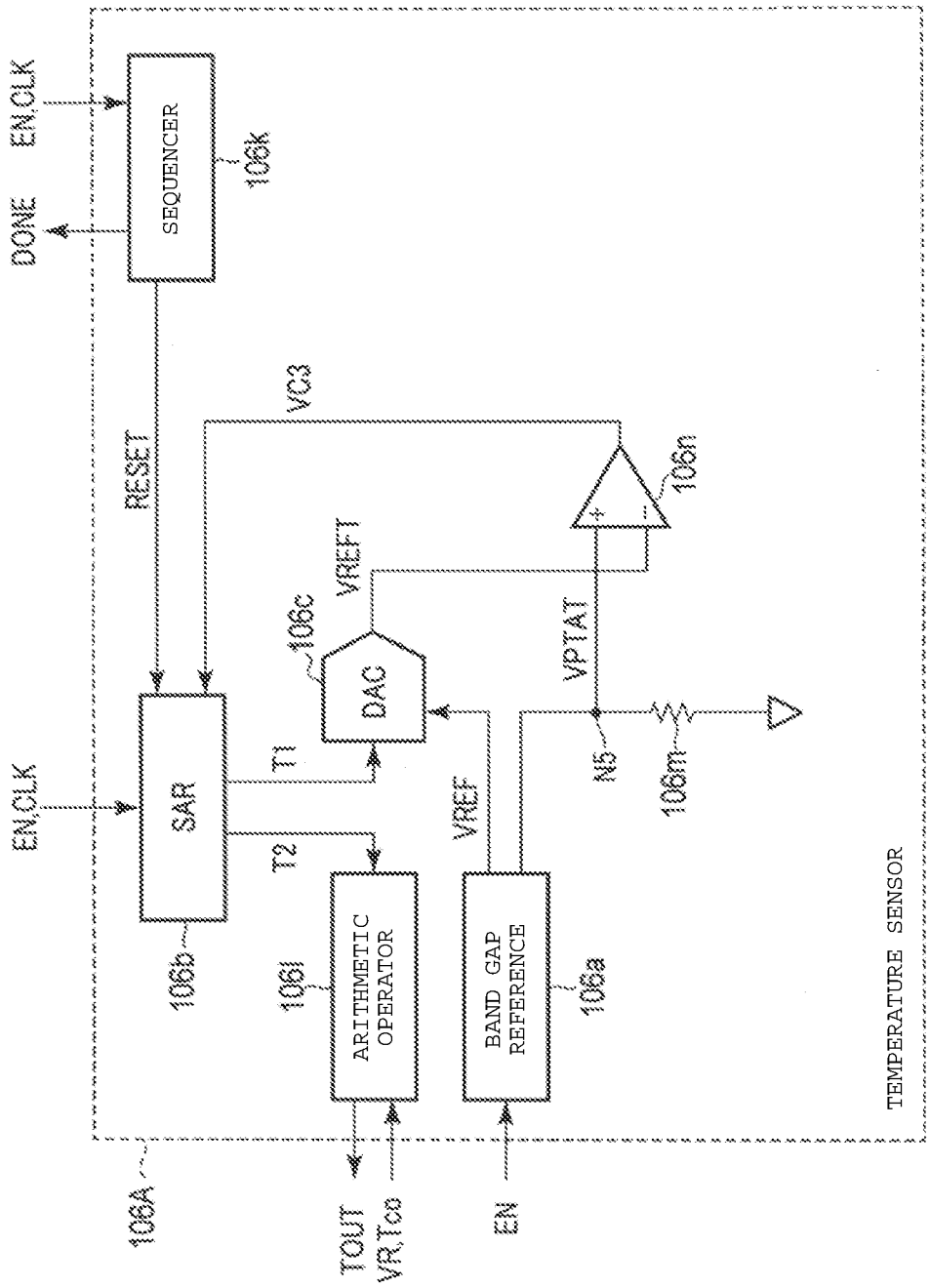
FIG. 8 is a block diagram that illustrates a temperature sensor of a semiconductor memory device according to Comparative Example 1 of the embodiment.

As illustrated in FIG. 8, a temperature sensor 106A of a semiconductor memory device according to Comparative Example 1 does not include the resistive element 106d, the resistive element 106e, the voltage comparison circuit 106g, the voltage comparison circuit 106h, and the AND operation circuit 106j.

The temperature sensor 106A of the semiconductor memory device according to Comparative Example 1 does not perform the temperature measurement operation of Steps S101 and S102 described above.

Figure 9:
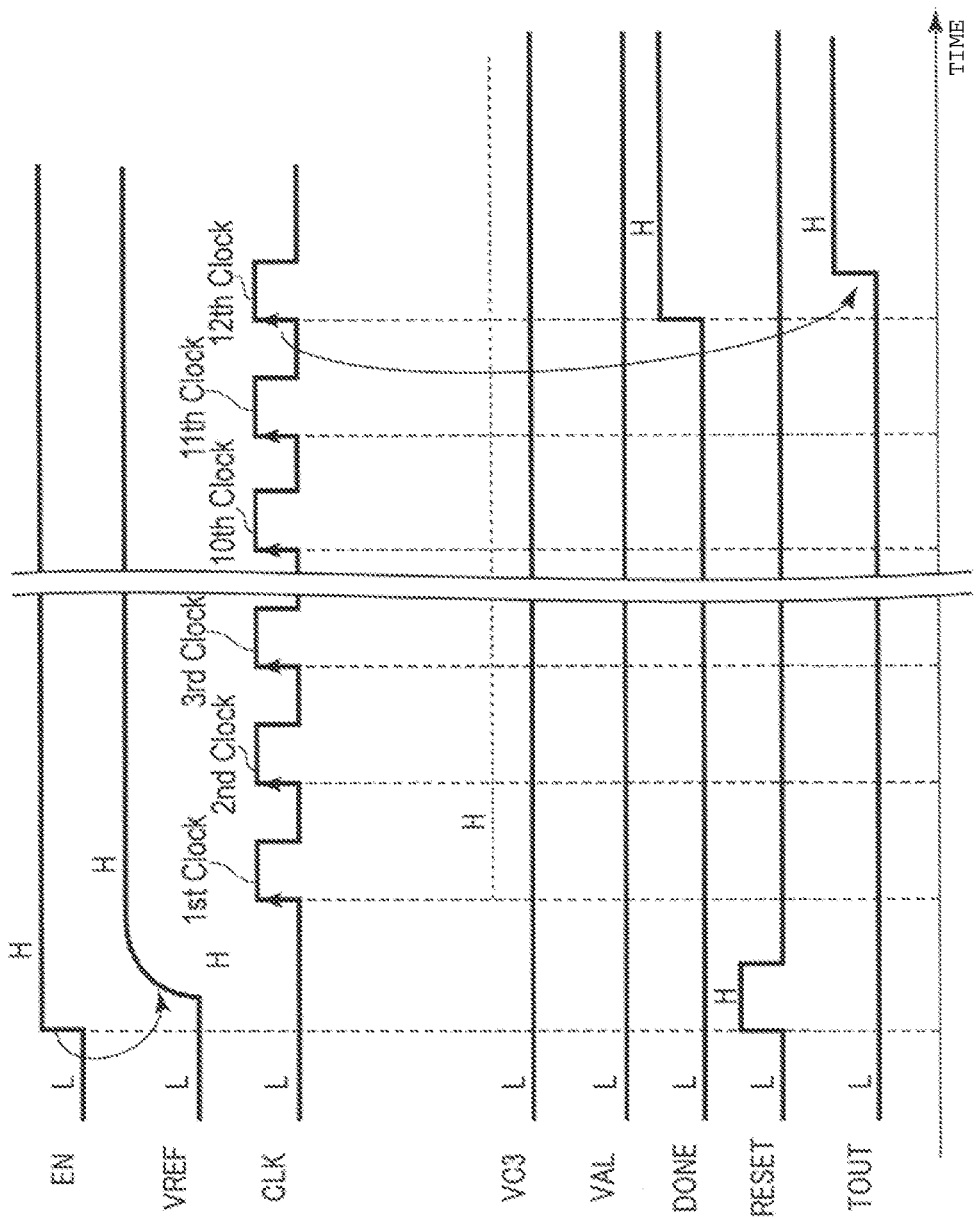
FIG. 9 is a waveform diagram of the temperature sensor of the semiconductor memory device according to Comparative Example 1 of the embodiment.

For this reason, as illustrated in FIG. 9, the temperature sensor 106A of the semiconductor memory device according to Comparative Example 1 performs a sampling operation every time.

However, according to the embodiment described above, in a case where the previous temperature of the NAND flash memory 100 does not change over the predetermined value (dTMP), a sampling operation does not need to be performed, and accordingly, the temperature sensor can be operated at a speed higher than that of Comparative Example 1.

Subsequently, Comparative Example 2 will be described with reference to FIG. 10.

Figure 10:
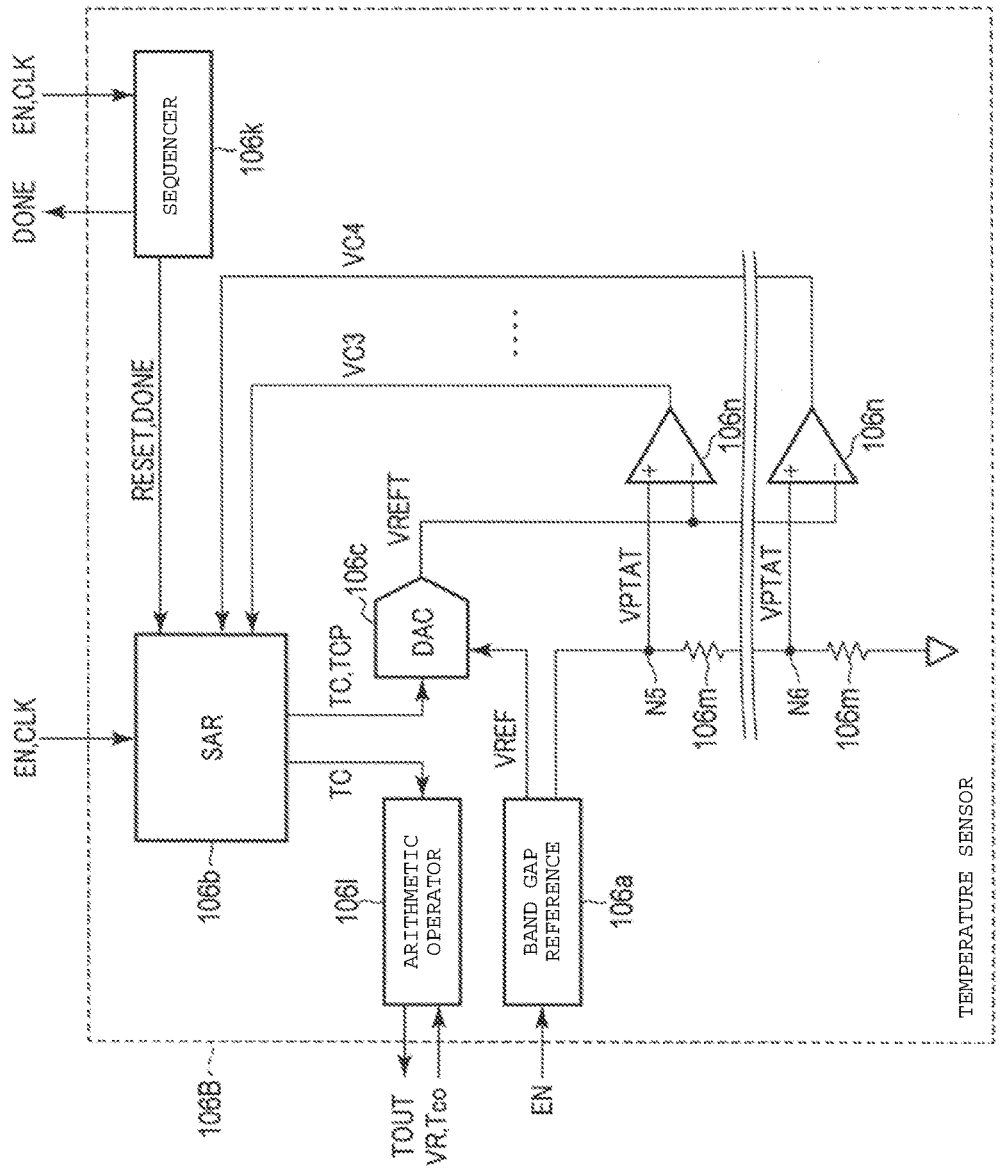
FIG. 10 is a block diagram that illustrates a temperature sensor of a semiconductor memory device according to Comparative Example 2 of the embodiment.

As illustrated in FIG. 10, a temperature sensor 106B of a semiconductor memory device according to Comparative Example 2 includes, for example, 15 resistive elements 106m and 15 voltage comparison circuits 106n. Accordingly, the sampling operation can be performed at a high speed. However, the circuit area of the temperature sensor 106B according to Comparative Example 2 is larger than that of the temperature sensor of the embodiment. For this reason, Comparative Example 2 is not desirable also from the viewpoint of miniaturizing the semiconductor memory device.

As above, according to the embodiment described above, the operation can be performed at a high speed while an increase in the circuit area of the semiconductor memory device is prevented.

<2> Modification

A modification of the embodiment will be described with reference to FIG. 11.

As described above, the temperature sensor 106 generates a voltage generation signal before an access operation. However, the temperature sensor 106 may perform a temperature measurement operation during an access operation or in a case where an access operation is not performed.

The operation of a temperature sensor 106 of a semiconductor memory device according to a modification of the embodiment will be described with reference to FIG. 11.

[Step S301 to Step S304]

The NAND flash memory 100 operates similar to Steps S101 to S104.

[Step S305]

In a case where it is determined that the temperature code TC represents that "a temperature change is within the set value" (Step S302: Yes), the sequencer 106k maintains the temperature code TC.

As above, by performing a temperature measurement operation in advance at the timing when there is no influence on the time of access operation, the accuracy of the temperature code TC can be increased.

In the embodiment described above, while the resistive elements 106d, 106e, and 106f are used, the configuration is not limited thereto, and thus, any configuration capable of lowering the voltage VPTAT_H may be employed.

In addition, in the embodiment described above, (1) in the read operation, the voltage applied to a word line selected for the read operation of the level A is, for example, in the range of 0 V to 0.55 V. However, the voltage is not limited thereto but may be in the range of any one of 0.1 V to 0.24 V, 0.21 V to 0.31 V, 0.31 V to 0.4 V, 0.4 V to 0.5 V, and 0.5 V to 0.55 V.

The voltage applied to a word line selected for the read operation of the level B is, for example, in the range of 1.5 V to 2.3 V. However, the voltage is not limited thereto but may be in the range of any one of 1.65 V to 1.8 V, 1.8 V to 1.95 V, 1.95 V to 2.1 V, and 2.1 V to 2.3 V.

The voltage applied to a word line selected for the read operation of the level C is, for example, in the range of 3.0 V to 4.0 V. However, the voltage is not limited thereto but may be in the range of any one of 3.0 V to 3.2 V, 3.2 V to 3.4 V, 3.4 V to 3.5 V, 3.5 V to 3.6 V, and 3.6 V to 4.0 V.

A time (tR) for a read operation, for example, may be in the range of any one of 25 μs to 38 μs, 38 μs to 70 μs, and 70 μs to 80 μs.

(2) The write operation, as described above includes the program operation and the verification operation. In the write operation, the voltage that is initially applied to a word line selected when the program operation is performed is, for example, in the range of 13.7 V to 14.3 V. However, the applied voltage is not limited thereto but, for example, may be in the range of any one of 13.7 V to 14.0 V and 14.0 V to 14.6 V.

A voltage that is initially applied to a selected word line when writing for an odd-numbered word line is performed and a voltage that is initially applied to a selected word line when writing for an even-numbered word line is performed may be changed.

When the program operation is performed using an incremental step pulse program (ISPP) system, a step-up voltage, for example, may be about 0.5 V.

A voltage applied to a non-selected word line, for example, may be in the range of 6.0 V to 7.3 V. However, the applied voltage is not limited to this case but, for example, may be in the range of 7.3 V to 8.4 V or 6.0 V or less.

The applied pass voltage may be changed depending on whether the non-selected word line is an odd-numbered word line or an even-numbered word line.

A time (tProg) for a write operation, for example, may be in the range of 1700 μs to 1800 μs, 1800 μs to 1900 μs, or 1900 μs to 2000 μs.

(3) In an erasing operation, a voltage initially applied to a well that is formed in an upper portion of the semiconductor substrate and has the memory cell arranged on the upper side, for example, is in the range of 12 V to 13.6 V. However, the applied voltage is not limited to such a case but, for example, may be in the range of any one of 13.6 V to 14.8 V, 14.8 V to 19.0 V, 19.0 V to 19.8 V, and 19.8 V to 21 V.

A time (tErase) for an erasing operation, for example, may be in the range of any one of 3000 μs to 4000 μs, 4000 μs to 5000 μs, and 4000 μs to 9000 μs.

(4) In the structure of the memory cell, the charge storage layer disposed on the semiconductor substrate (e.g., silicon substrate) via a tunnel insulating film having a film thickness of 4 to 10 nm is provided. This charge storage layer may be configured to have a stacked structure of an insulating film of SiN, SiON, or the like having a film thickness of 2 to 3 nm and polysilicon having a film thickness of 3 to 8 nm. In addition, a metal such as RU may be added to the polysilicon. On the charge storage layer, an insulating film is provided. This insulating film, for example, includes a silicon oxide film having a film thickness of 4 to 10 mm interposed between a lower layer High-k film having a film thickness of 3 to 10 nm and an upper layer High-k film having a film thickness of 3 to 10 nm. An example of the High-k film is HfO. In addition, the film thickness of the silicon oxide film may be larger than that of the High-k film. On the insulating film, a control electrode having a film thickness of 30 nm to 70 nm is formed via a material having a film thickness of 3 to 10 nm is formed. Here, such a material is a metal oxide film such as TaO or a metal nitride film such as TaN. W or the like may be used for the control electrode.

In addition, an air gap may be formed between memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a memory cell array;
    a temperature sensor configured to generate a first voltage based on a temperature of the semiconductor memory device, compare the first voltage with a second voltage that is based on a result of previous temperature measurement, and generate a voltage generation signal based on a result of comparing the first voltage with the second voltage; and
    a voltage generating circuit that generates a voltage applied to the memory cell array based on the voltage generation signal,
    wherein the temperature sensor is further configured to:
        determine whether or not a temperature change from the previous temperature measurement is within a set value, and
        generate the voltage generation signal having a first level or a second level based on whether or not the temperature change from the previous temperature measurement is within the set value.

2. The semiconductor memory device according to claim 1, wherein the temperature sensor is further configured to:
    upon determining that the temperature change from the previous temperature measurement is within the set value, generate the voltage generation signal having the first level, which is based on the result of the previous temperature measurement.

3. The semiconductor memory device according to claim 1, wherein the temperature sensor is further configured to:
    upon determining that the temperature change from the previous temperature measurement is not within the set value, perform a current temperature measurement, and generate the voltage generation signal having the second level based on a result of the current temperature measurement.

4. The semiconductor memory device according to claim 3, wherein the temperature sensor is further configured to:
    after performing the current temperature measurement, updating the result of the previous temperature measurement with the result of the current temperature measurement.

5. The semiconductor memory device according to claim 1, wherein the temperature sensor determines whether or not the temperature change from the previous temperature measurement is within the set value by generating a third voltage by lowering the first voltage, comparing the first voltage with the second voltage, and comparing the third voltage with the second voltage.

6. The semiconductor memory device according to claim 5, wherein the temperature sensor determines that the temperature change from the previous temperature measurement is within the set value if the first voltage is higher than the second voltage, and the third voltage is lower than the second voltage.

7. The semiconductor memory device according to claim 5, wherein the temperature sensor generates the third voltage using a resistive element having a first end to which the first voltage is applied and a second end which is at the third voltage.

8. The semiconductor memory device according claim 1, wherein the temperature sensor stores the result of the previous temperature measurement as an encoded binary value.

9. The semiconductor memory device according claim 1, wherein the temperature sensor further includes a D/A converter to generate the second voltage from the encoded binary value.

10. A method of generating voltages applied to a memory cell array of a semiconductor memory device, comprising:
generating a first voltage based on a temperature of the semiconductor memory device;
comparing the first voltage with a second voltage that is based on a result of previous temperature measurement;
determining whether or not a temperature change from the previous temperature measurement is within a set value;
generating a voltage generation signal having a first level or a second level based on whether or not the temperature change from the previous temperature measurement is within the set value; and
generating voltages applied to the memory cell array based on the voltage generation signal.

11. The method according to claim 10, further comprising:
upon determining that the temperature change from the previous temperature measurement is within the set value, generating the voltage generation signal having the first level, which is based on the result of the previous temperature measurement.

12. The method according to claim 10, further comprising:
upon determining that the temperature change from the previous temperature measurement is not within the set value, performing a current temperature measurement, and generating the voltage generation signal having the second level based on a result of the current temperature measurement.

13. The method according to claim 12, further comprising:
after performing the current temperature measurement, updating the result of the previous temperature measurement with the result of the current temperature measurement.

14. The method according to claim 10, wherein said determining whether or not the temperature change from the previous temperature measurement is within the set value includes:
generating a third voltage by lowering the first voltage;
comparing the first voltage with the second voltage; and
comparing the third voltage with the second voltage.

15. The method according to claim 14, wherein the temperature change from the previous temperature measurement is determined to be within the set value if the first voltage is higher than the second voltage, and the third voltage is lower than the second voltage.

16. The method according to claim 14, wherein the third voltage is generated using a resistive element having a first end to which the first voltage is applied and a second end which is at the third voltage.

17. The method according claim 10, further comprising:
storing the result of the previous temperature measurement as an encoded binary value.

18. The method according claim 10, wherein the second voltage is generated from the encoded binary value using a D/A converter.

* * * * *